US008499272B2

(12) United States Patent
Ishii

(10) Patent No.: US 8,499,272 B2
(45) Date of Patent: Jul. 30, 2013

(54) SEMICONDUCTOR DEVICE BASED ON POWER GATING IN MULTILEVEL WIRING STRUCTURE

(75) Inventor: Toshinao Ishii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/434,654

(22) Filed: Mar. 29, 2012

(65) Prior Publication Data

US 2012/0249226 A1 Oct. 4, 2012

(30) Foreign Application Priority Data

Mar. 31, 2011 (JP) ................................ 2011-079399

(51) Int. Cl.
*G06F 17/50* (2006.01)

(52) U.S. Cl.
USPC ............ 716/127; 716/119; 716/120; 716/133

(58) Field of Classification Search
USPC ................................ 716/119–120, 127, 133
See application file for complete search history.

(56) References Cited

U.S. PATENT DOCUMENTS

| | | | | |
|---|---|---|---|---|
| 5,486,774 | A | 1/1996 | Douseki et al. | |
| 6,034,563 | A | 3/2000 | Mashiko | |
| 6,215,159 | B1 | 4/2001 | Fujita et al. | |
| 6,462,978 | B2 * | 10/2002 | Shibata et al. | 365/63 |
| 6,914,449 | B2 * | 7/2005 | Kaviani | 326/41 |
| 7,126,837 | B1 * | 10/2006 | Banachowicz et al. | 365/63 |
| 7,436,205 | B2 * | 10/2008 | Tada | 326/33 |
| 7,590,962 | B2 * | 9/2009 | Frenkil et al. | 716/120 |
| 7,987,441 | B2 * | 7/2011 | Frenkil et al. | 716/127 |
| 8,191,026 | B2 * | 5/2012 | Motomura | 716/119 |
| 2007/0280012 | A1 * | 12/2007 | Obayashi et al. | 365/200 |
| 2009/0184758 | A1 * | 7/2009 | Motomura | 327/544 |

FOREIGN PATENT DOCUMENTS

| | | |
|---|---|---|
| JP | 2009-170650 A | 7/2009 |

* cited by examiner

*Primary Examiner* — Naum Levin
(74) *Attorney, Agent, or Firm* — McGinn IP Law Group, PLLC

(57) ABSTRACT

A semiconductor device includes: first and second circuit cell arrays extending in first direction; first and second power supply lines each extending in first direction and arranged over first circuit cell array, first power supply line being supplied with first power source voltage; third power supply line extending in first direction separately from second power supply line, arranged over second circuit cell array, and supplied with second power source voltage; first transistor coupled between second and third power supply lines; and first circuit arranged on first circuit cell array and operating on first and second power source voltages supplied from first and second power supply lines, respectively.

20 Claims, 15 Drawing Sheets

CK
ADD
CMD
101
102
103
104
105
106
107
108
DQ0
DQn
VDD
VSS
MEMORY CELL ARRAY
READ/WRITE CONTROL
CIRCUIT UNIT
109 POWER GATING UTILIZATION
CIRCUIT UNIT

Bank0
Bank1
Bank2
Bank3
Bank4
Bank5
Bank6
Bank7
YDEC
AMP
YDEC
XDEC
DQ
BRWBUFP
BRWBUFPT DRIVER REGION
FUNCTIONAL CIRCUIT REGION
A1
A2
301
312
DN1
302
311
DP1
301'
312'
302'
311'
301"
VPERI
Pch REGION
Nch REGION
VSSZ
VSS
VPERIZ
CTR_N
CTR_P
322
321
CIRCUIT CELL ARRAY T1
CIRCUIT CELL ARRAY T2
CIRCUIT CELL ARRAY T3
CIRCUIT CELL ARRAY T4
POWER SUPPLY LINE (1AL)
x
y

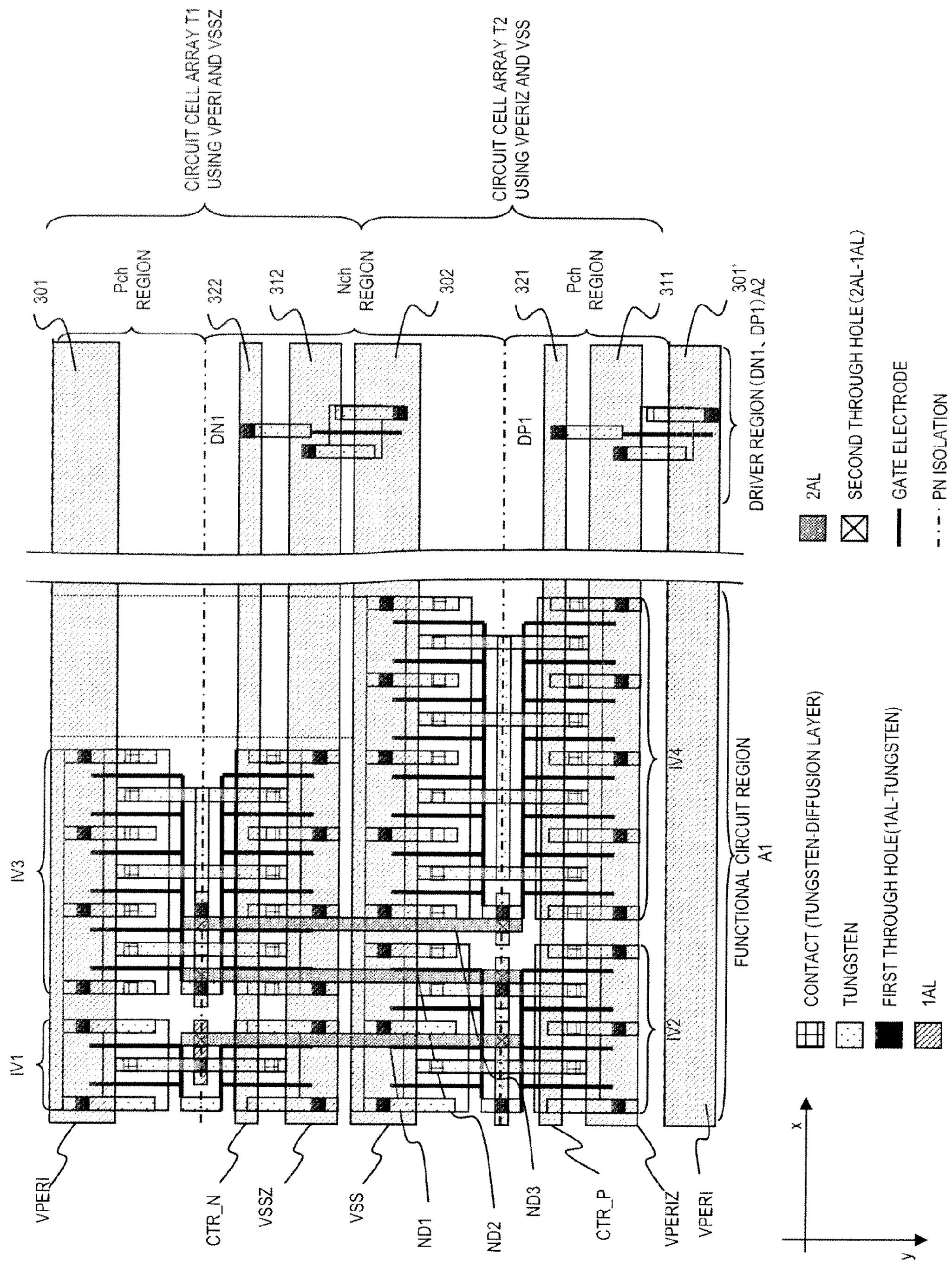

FIG. 5
CIRCUIT CELL ARRAY T1 USING VPERI AND VSSZ
CIRCUIT CELL ARRAY T2 USING VPERIZ AND VSS
301
Pch REGION
322
312
Nch REGION
302
321
Pch REGION
311
301'
DN1
DP1
DRIVER REGION (DN1, DP1) A2
IV1
IV3
IV2
IV4
FUNCTIONAL CIRCUIT REGION A1
VPERI
CTR_N
VSSZ
VSS
ND1
ND2
ND3
CTR_P
VPERIZ
VPERI
CONTACT (TUNGSTEN-DIFFUSION LAYER)
TUNGSTEN
FIRST THROUGH HOLE(1AL-TUNGSTEN)
1AL
2AL
SECOND THROUGH HOLE (2AL-1AL)
GATE ELECTRODE
PN ISOLATION
x
y

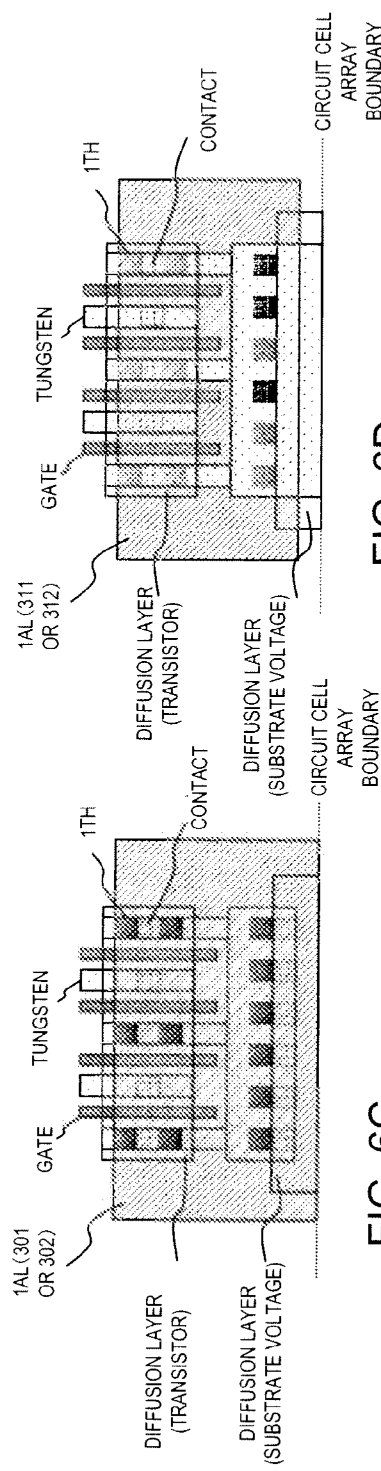
FIG. 6A
FIG. 6B
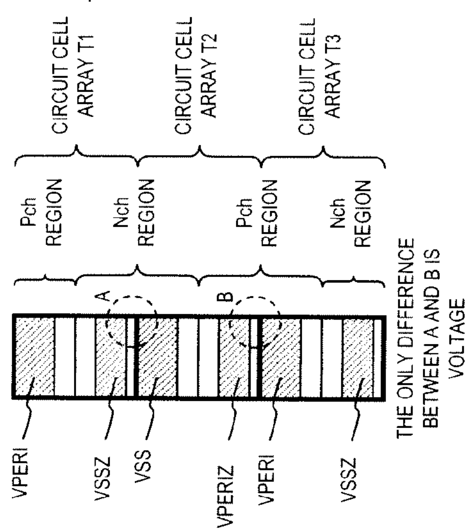
FIG. 6C
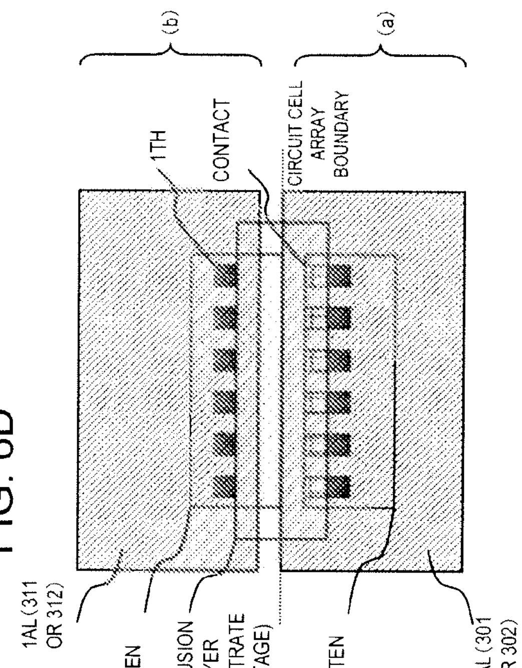
FIG. 6D

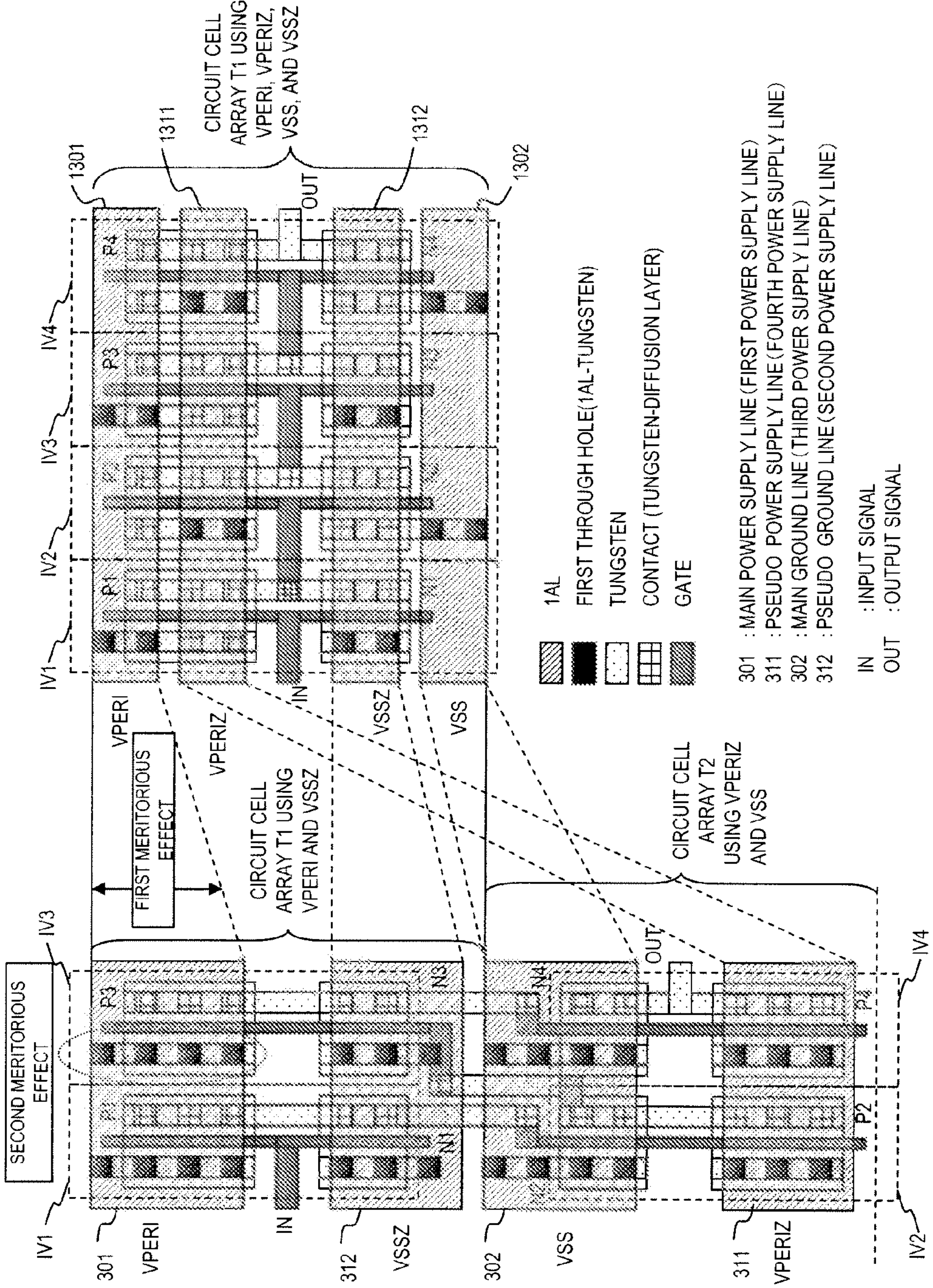
FIG. 7A
FIG. 7B
SECOND MERITORIOUS EFFECT
FIRST MERITORIOUS EFFECT
IV1
IV2
IV3
IV4
301
VPERI
IN
312
VSSZ
302
VSS
311
VPERIZ
P1
P2
P3
P4
N1
N2
N3
N4
OUT
CIRCUIT CELL ARRAY T1 USING VPERI AND VSSZ
CIRCUIT CELL ARRAY T2 USING VPERIZ AND VSS
1301
1311
1312
1302
CIRCUIT CELL ARRAY T1 USING VPERI, VPERIZ, VSS, AND VSSZ
1AL
FIRST THROUGH HOLE(1AL-TUNGSTEN)
TUNGSTEN
CONTACT (TUNGSTEN-DIFFUSION LAYER)
GATE
301 : MAIN POWER SUPPLY LINE (FIRST POWER SUPPLY LINE)
311 : PSEUDO POWER SUPPLY LINE (FOURTH POWER SUPPLY LINE)
302 : MAIN GROUND LINE (THIRD POWER SUPPLY LINE)
312 : PSEUDO GROUND LINE (SECOND POWER SUPPLY LINE)
IN : INPUT SIGNAL
OUT : OUTPUT SIGNAL

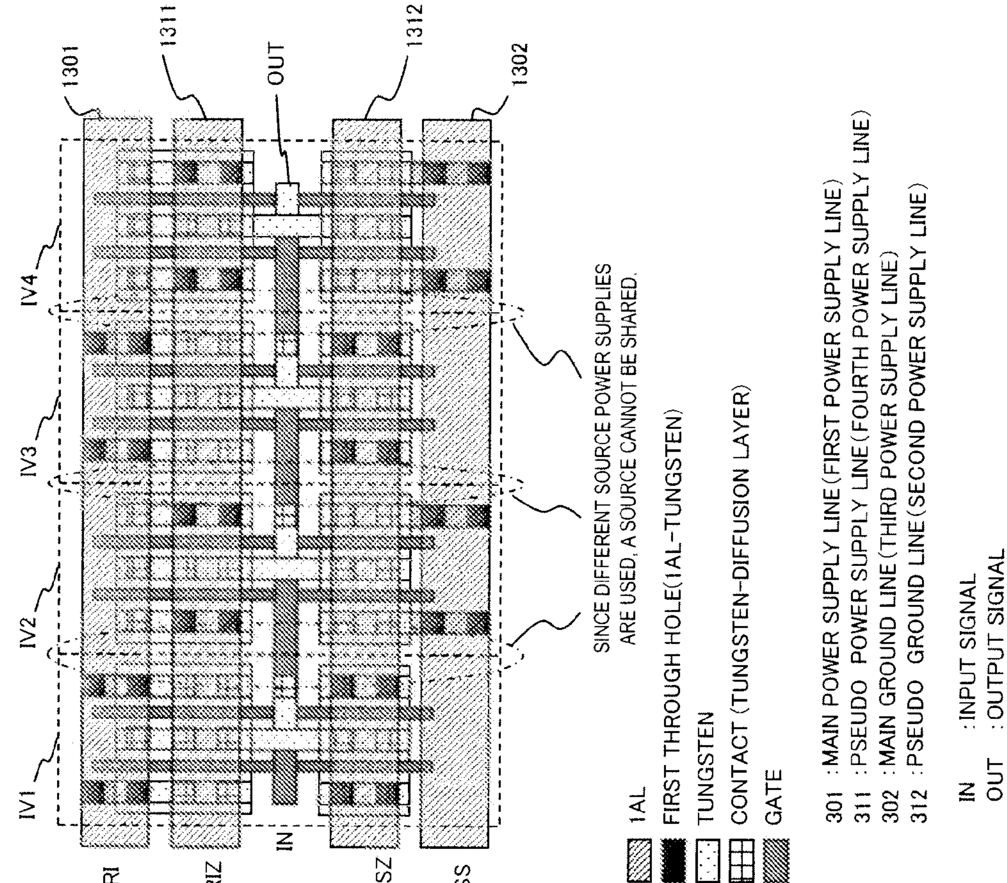
FIG. 8B
1301
1311
OUT
1312
1302
IV1
IV2
IV3
IV4
VPERI
VPERIZ
IN
VSSZ
VSS
SINCE DIFFERENT SOURCE POWER SUPPLIES ARE USED, A SOURCE CANNOT BE SHARED.
1AL
FIRST THROUGH HOLE(1AL-TUNGSTEN)
TUNGSTEN
CONTACT (TUNGSTEN-DIFFUSION LAYER)
GATE
301 :MAIN POWER SUPPLY LINE (FIRST POWER SUPPLY LINE)
311 :PSEUDO POWER SUPPLY LINE (FOURTH POWER SUPPLY LINE)
302 :MAIN GROUND LINE (THIRD POWER SUPPLY LINE)
312 :PSEUDO GROUND LINE (SECOND POWER SUPPLY LINE)
IN :INPUT SIGNAL
OUT :OUTPUT SIGNAL

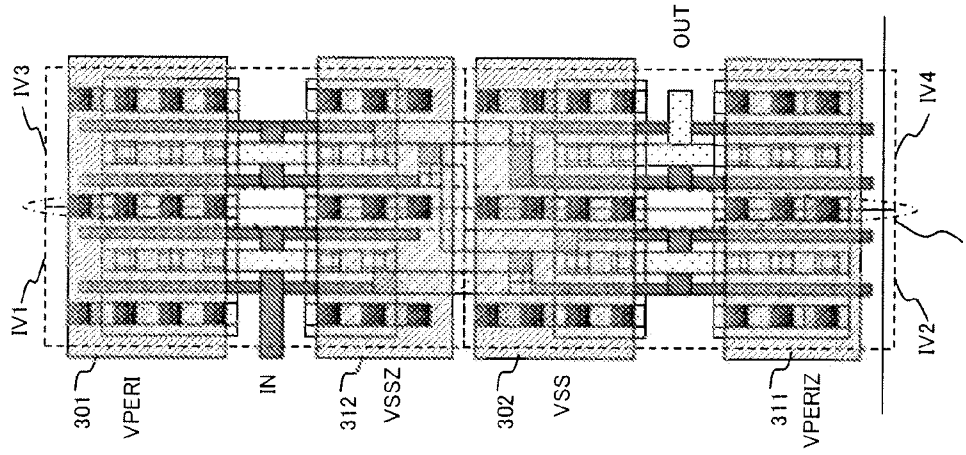
FIG. 8A
IV1
IV3
IV2
IV4
301
VPERI
IN
312
VSSZ
302
VSS
OUT
311
VPERIZ
SINCE AN IDENTICAL SOURCE POWER SUPPLY IS USED, A SOURCE CAN BE SHARED.

DRIVER
301
VPERI
312
VSSZ
302
VSS
311
VPERIZ
Pch REGION
Nch REGION
CIRCUIT CELL ARRAY T1
CIRCUIT CELL ARRAY T2
L1
L2
DISTANCE BETWEEN POWER GATING DRIVER AND TRANSISTOR USING PSEUDO POWER SUPPLY
1301
1311
1312
1302
: Pch TRANSISTOR
: Nch TRANSISTOR

CIRCUIT CELL ARRAY T1
CIRCUIT CELL ARRAY T2
CIRCUIT CELL ARRAY T3
CIRCUIT CELL ARRAY T4
Pch REGION
Nch REGION
VPERI
VSSZ
VSS
VPERIZ
301
312
302
311
311'
302'
312'
301'
SYMMETRY AXIS
MIRROR ARRANGEMENT
POWER SUPPLY LINE (1AL)
x
y

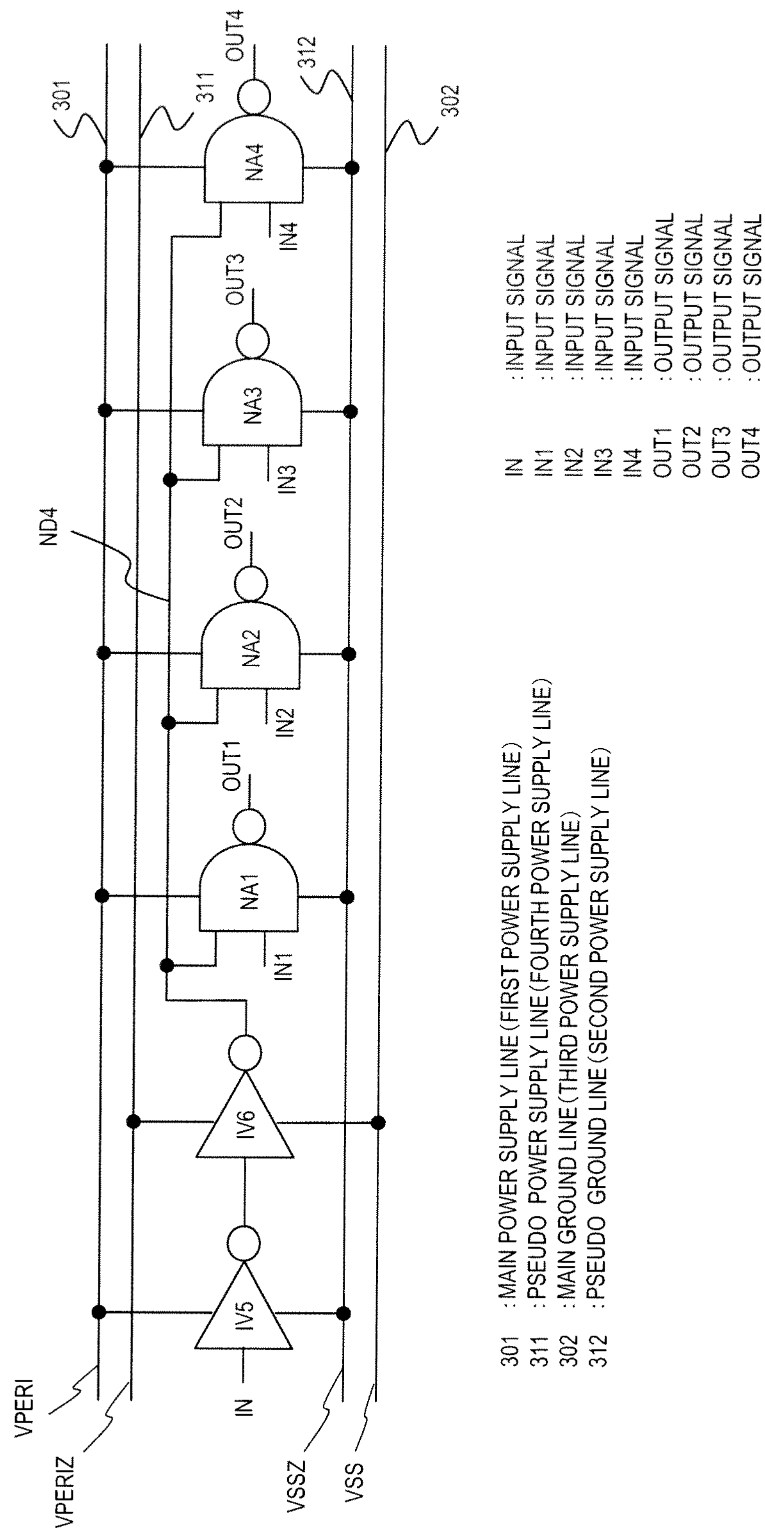
FIG. 14
VPERI
VPERIZ
IN
VSSZ
VSS
IV5
IV6
NA1
NA2
NA3
NA4
IN1
IN2
IN3
IN4
OUT1
OUT2
OUT3
OUT4
ND4
301
311
312
302
301 : MAIN POWER SUPPLY LINE (FIRST POWER SUPPLY LINE)
311 : PSEUDO POWER SUPPLY LINE (FOURTH POWER SUPPLY LINE)
302 : MAIN GROUND LINE (THIRD POWER SUPPLY LINE)
312 : PSEUDO GROUND LINE (SECOND POWER SUPPLY LINE)
IN : INPUT SIGNAL
IN1 : INPUT SIGNAL
IN2 : INPUT SIGNAL
IN3 : INPUT SIGNAL
IN4 : INPUT SIGNAL
OUT1 : OUTPUT SIGNAL
OUT2 : OUTPUT SIGNAL
OUT3 : OUTPUT SIGNAL
OUT4 : OUTPUT SIGNAL

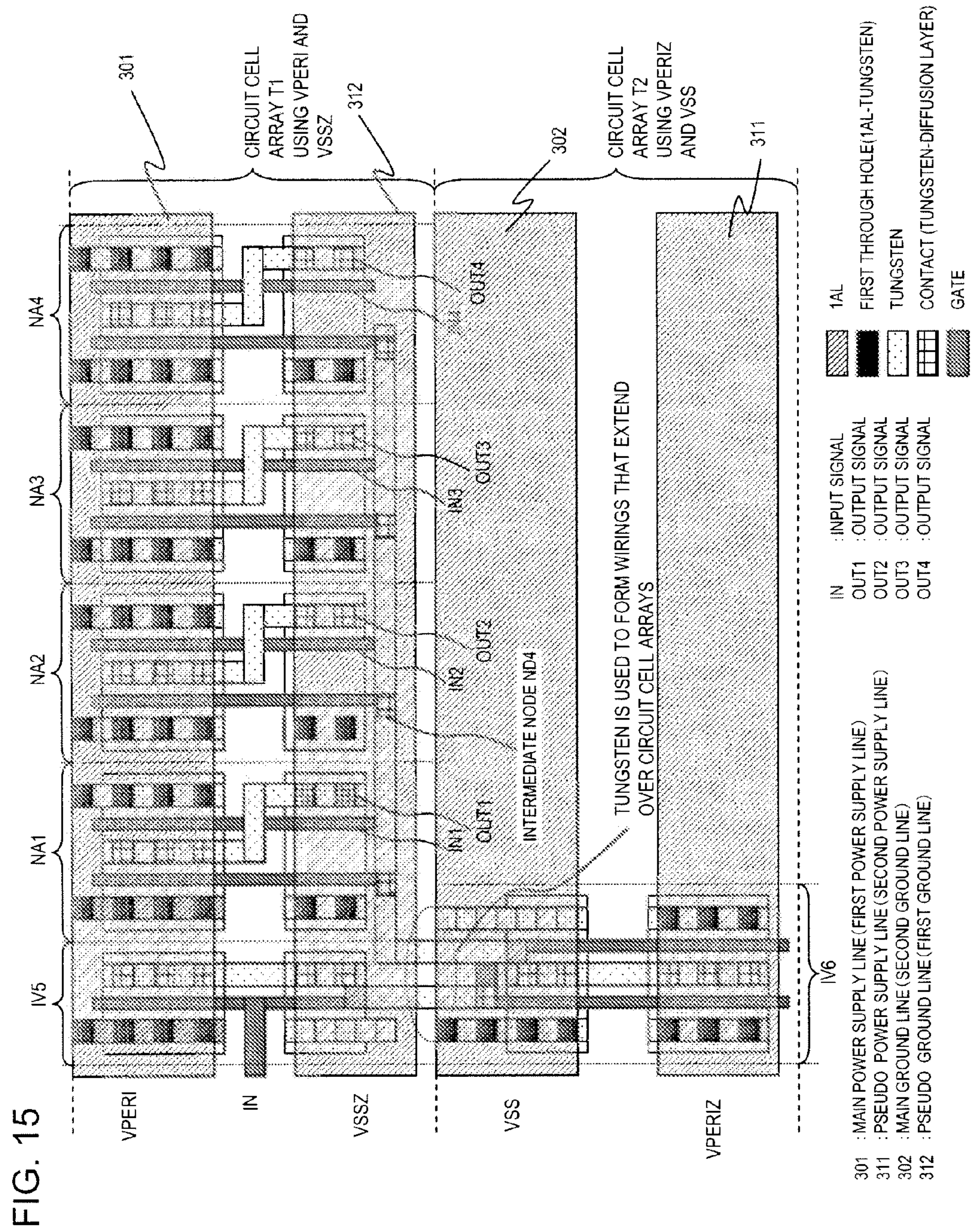
FIG. 15
VPERI
IN
VSSZ
VSS
VPERIZ
IV5
NA1
NA2
NA3
NA4
IV6
301
312
302
311
CIRCUIT CELL ARRAY T1 USING VPERI AND VSSZ
CIRCUIT CELL ARRAY T2 USING VPERIZ AND VSS
IN1
OUT1
IN2
OUT2
IN3
OUT3
OUT4
INTERMEDIATE NODE ND4
TUNGSTEN IS USED TO FORM WIRINGS THAT EXTEND OVER CIRCUIT CELL ARRAYS
301 : MAIN POWER SUPPLY LINE (FIRST POWER SUPPLY LINE)
311 : PSEUDO POWER SUPPLY LINE (SECOND POWER SUPPLY LINE)
302 : MAIN GROUND LINE (SECOND GROUND LINE)
312 : PSEUDO GROUND LINE (FIRST GROUND LINE)
IN : INPUT SIGNAL
OUT1 : OUTPUT SIGNAL
OUT2 : OUTPUT SIGNAL
OUT3 : OUTPUT SIGNAL
OUT4 : OUTPUT SIGNAL
1AL
FIRST THROUGH HOLE (1AL-TUNGSTEN)
TUNGSTEN
CONTACT (TUNGSTEN-DIFFUSION LAYER)
GATE

SEMICONDUCTOR DEVICE BASED ON POWER GATING IN MULTILEVEL WIRING STRUCTURE

REFERENCE TO RELATED APPLICATION

This application is based upon and claims the benefit of the priority of Japanese patent application No. 2011-079399, filed on Mar. 31, 2011, the disclosure of which is incorporated herein in its entirety by reference thereto.

TECHNICAL FIELD

The present invention relates to a semiconductor device, and in particular, to a semiconductor device based on power gating.

BACKGROUND

Japanese Patent Kokai Publication No. JP2009-170650A describes arrangement of circuit cells and power supply lines of a semiconductor device using an MTCMOS (Multi-Threshold Complementary Metal Oxide Semiconductor) technique (hereinafter referred to as "power gating"). Further discussion of the power gating can be found in commonly assigned, U.S. Pat. No. 5,486,774, U.S. Pat. No. 6,034,563 and U.S. Pat. No. 6,215,159.

The entire disclosures of the above mentioned Patent Documents are incorporated herein by reference thereto. The following analyses are made by the present invention.

As illustrated in FIG. 3 of the above Patent Document, based on the semiconductor device disclosed in the Patent Document, at least a total of three power supply lines of branch lines 20D and 20S and a virtual VSS line 30S need to be arranged in a single cell array (cell line). In addition, while not explicitly illustrated in FIG. 3 of the above Patent Document, normally, a signal array is arranged in a region between the branch line 20D and the virtual VSS line VSSV.

Thus, the regions that can be occupied by the power supply lines in the height direction of the cell array (in the direction perpendicular to the direction in which the cell array extends) are limited. Therefore, based on this configuration, for example, if miniaturization of circuit elements is advanced and if the size of the cell array in the height direction thereof is reduced, the regions that can be occupied by the power supply lines are accordingly reduced. As a result, resistance of the power supply lines is increased, counted as a problem.

SUMMARY

In one embodiment, there is provided a semiconductor device, comprising:

a first circuit cell array extending in a first direction;

a second circuit cell array extending in the first direction substantially in parallel to the first circuit cell array;

first and second power supply lines each extending in the first direction and arranged over the first circuit cell array, the first power supply line being supplied with a first power source voltage:

a third power supply line extending in the first direction separately from the second power supply line, arranged over the second circuit cell array, and supplied with a second power source voltage;

a first transistor coupled between the second power supply line and the third power supply line; and a first circuit arranged on the first circuit cell array and operating on the first power source voltage supplied from the first power supply line and the second power source voltage supplied from the second power supply line.

In another embodiment, there is provided a semiconductor device, comprising:

a first circuit cell array extending in a first direction;

a second circuit cell array extending in the first direction substantially in parallel to the first circuit cell array;

a main power supply line elongated in the first direction and arranged over the first circuit cell array;

a pseudo power supply line elongated in parallel to and separately from the first main supply line and arranged over the second circuit cell array;

a first circuit disposed in the first circuit cell array and including a first power supply node that is coupled to the main power supply line;

a second circuit disposed in the second circuit cell array and including a second power supply node that coupled to the pseudo power supply line; and a transistor coupled between the main power supply line and the pseudo power supply line.

BRIEF DESCRIPTION OF THE DRAWINGS

The above features and advantages of the present invention will be more apparent from the following description of certain preferred embodiments taken in conjunction with the accompanying drawings, in which:

FIG. 5 illustrates a detailed layout of a functional circuit region and a driver region in FIG. 3;

FIGS. 6A to 6D illustrate layouts of detailed configurations of a circuit cell array boundary portion in FIG. 5;

FIGS. 7A and 7B illustrate meritorious effects provided by the semiconductor device according to the exemplary embodiment;

FIGS. 5A and 8B illustrate a meritorious effect provided by the semiconductor device according to the exemplary embodiment;

FIG. 14 is a circuit diagram illustrating a configuration of a circuit arranged in the region A1 in FIG. 3;

FIG. 15 is a layout when the circuit in FIG. 14 is arranged in the functional circuit region.

EMBODIMENTS

Figure 1:
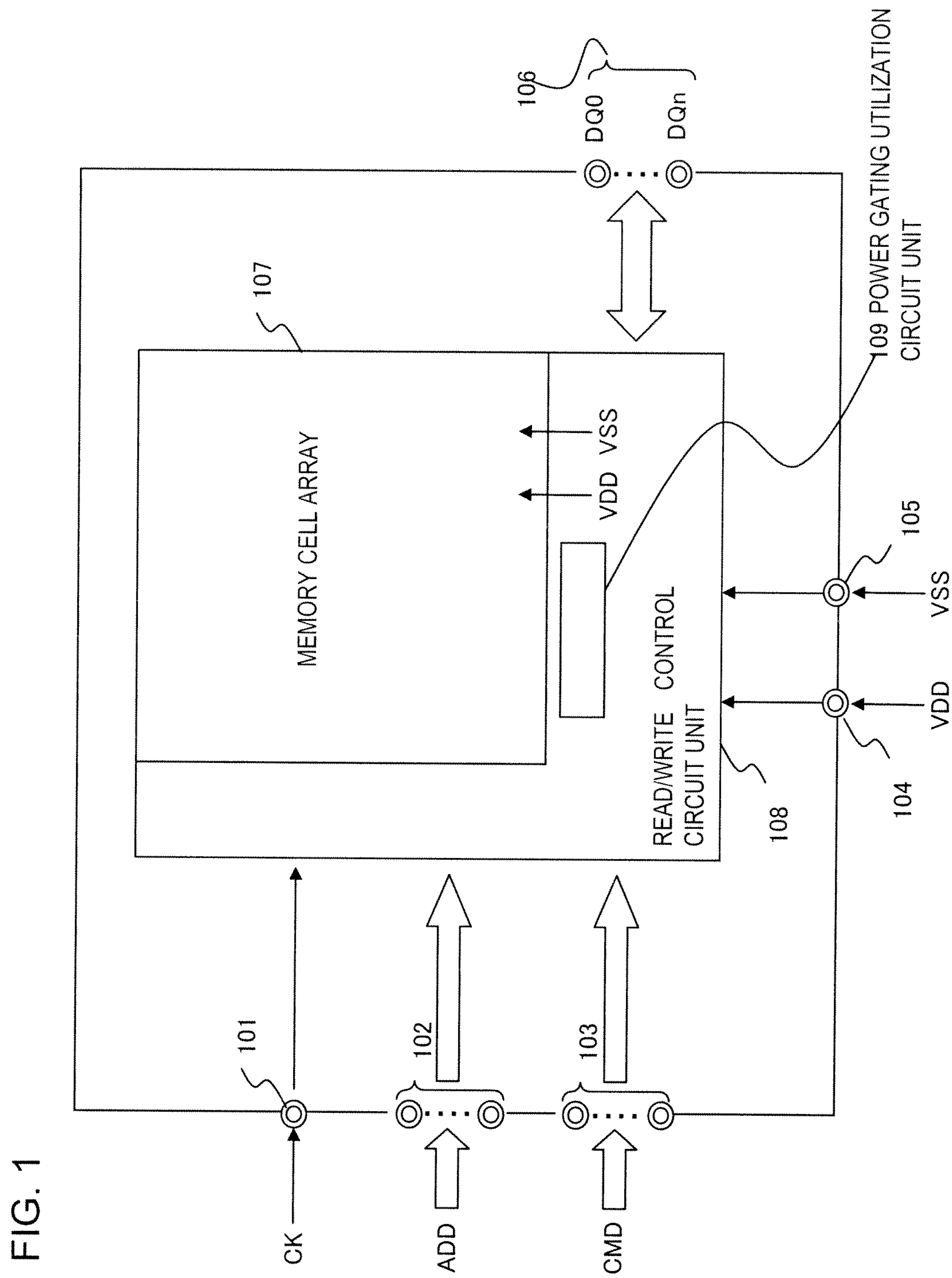
FIG. 1 is a block diagram schematically illustrating a configuration of a semiconductor device according to an exemplary embodiment.

Exemplary Embodiments of the present disclosure will hereinafter be described. However, the drawings and the reference symbols mentioned therein are merely used by way of examples to facilitate understanding of the present disclosure. Therefore, the present disclosure is not limited to the modes illustrated by the drawings and reference characters.

(Exemplary Embodiments)

A semiconductor device according to an exemplary embodiment will be described with reference to the drawings. FIG. 1 is a block diagram schematically illustrating a configuration of a semiconductor device according to the present exemplary embodiment. FIG. 1 illustrates a configuration of a DRAM, as an example of the semiconductor device.

In FIG. 1, the semiconductor device according to the present exemplary embodiment includes a clock node 101, address nodes 102, command (CMD) nodes 103, a power source (VDD) node 104, a ground (VSS) node 105, data input/output (I/O) nodes 106, a memory cell array 107, a read/write control circuit unit 108, and a power gating utilization circuit unit 109.

The read/write control circuit unit 108 is supplied with a driving voltage from the power source node 104 and the ground node 105. In addition, the read/write control circuit unit 108 receives a clock signal CK from the outside via the clock node 101 and operates based on the clock signal CK. In addition, the read/write control circuit unit 108 receives address signals ADD and command signals CMD from the outside via the address nodes 102 and the command nodes 103, respectively. In addition, the read/write control circuit unit 108 receives data DQ0 to DQn via the data I/O nodes 106 and writes the data DQ0 to DQn in memory elements included in the memory cell array 107. In addition, the read/write control circuit unit 108 reads data DQ0 to DQn from memory elements and outputs the data DQ0 to DQn via the data I/O nodes.

The power gating utilization circuit unit 109 is part of the read/write control circuit 108. When the semiconductor device is in a standby state, an input level, which is an input signal voltage level at an input node of this circuit, and an output level, which is an output signal voltage level at an output node of this circuit are fixed.

In addition, the power gating utilization circuit unit 109 partly or entirely includes a power supply shutdown configuration (namely, power gating) for reducing subthreshold leakage currents of transistors, which are active elements included in this circuit.

Figure 2:
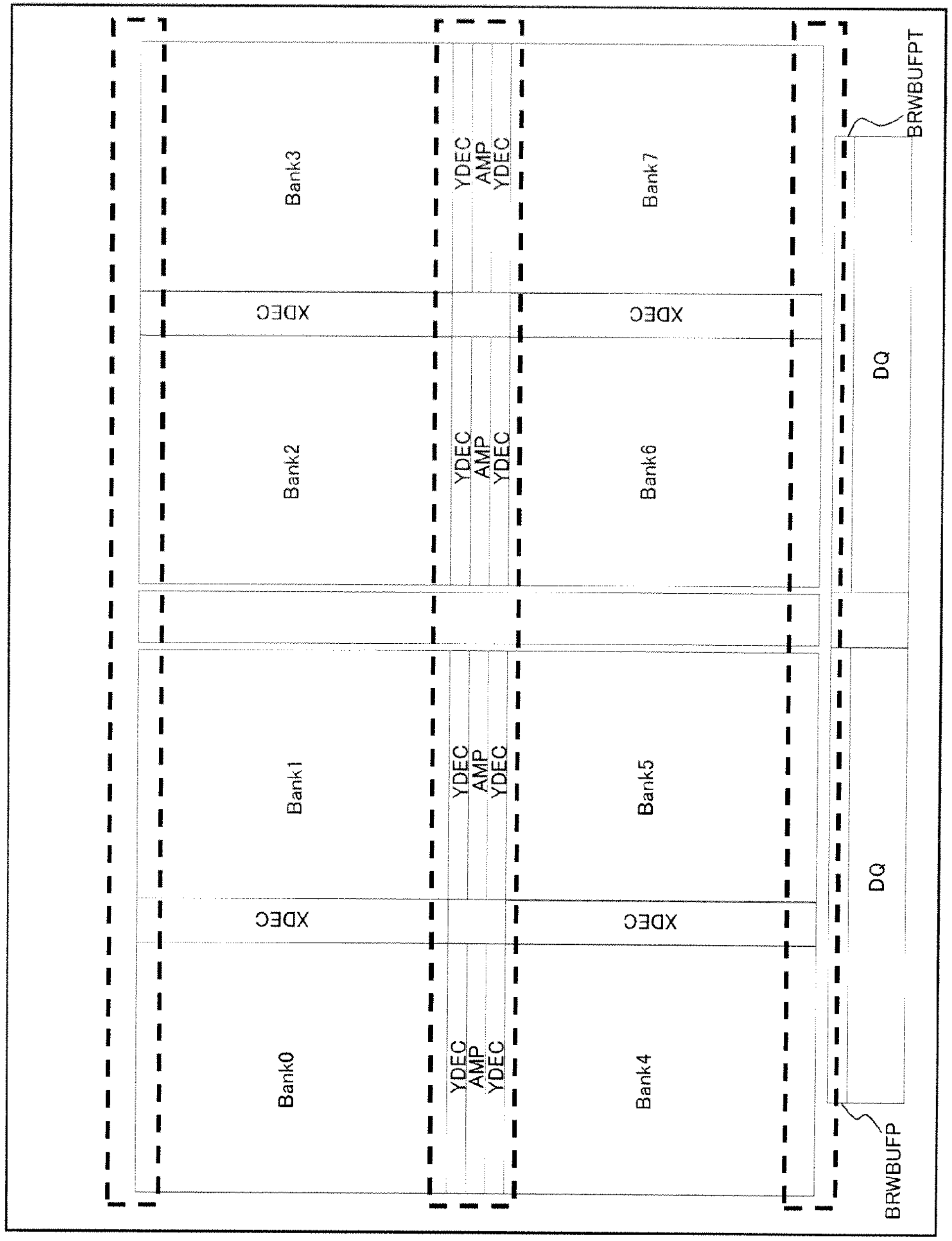
FIG. 2 illustrates suitable portions for arranging a power gating utilization circuit unit in the semiconductor device according to the exemplary embodiment.

FIG. 2 illustrates applicable examples of the semiconductor device according to the present exemplary embodiment. For example, the semiconductor device according to the present exemplary embodiment is applicable to portions where buffers are lined (repetition regions), such as to array interfaces. However, application of the semiconductor device according to the present exemplary embodiment is not limited to such repetition regions as illustrated in FIG. 2. The semiconductor device according to the present exemplary embodiment is applicable to other circuits using power gating.

In the read/write control circuit unit 108 in FIG. 1, an array face a circuit portion (any one of the portions surrounded by dashed lines in FIG. 2) arranged between a memory cell array and another control circuit. Specific examples of the array interface include a column decoder (YDEC), a data amplifier (AMP), and a read/write buffer (RWBUFF).

Figure 3:
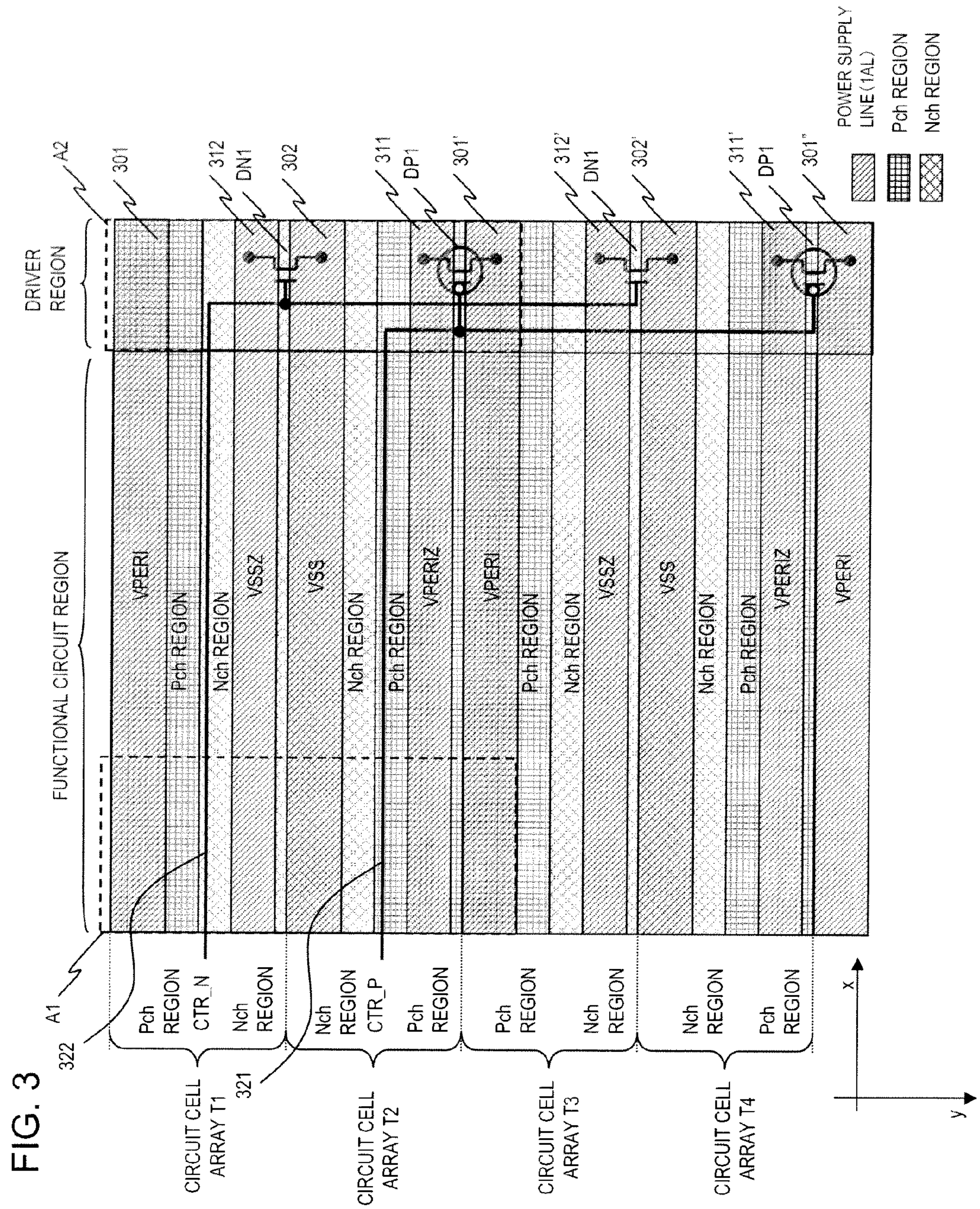
FIG. 3 illustrates a layout of a power gating utilization circuit unit in the semiconductor device according to the exemplary embodiment.

FIG. 3 illustrates a layout of the power gating utilization circuit unit 109 in the semiconductor device according to the present exemplary embodiment. The multi-level wiring structure of the power gating utilization circuit unit 109 will be described in detail with reference to FIG. 5 later.

In FIG. 3, four circuit cell arrays T1 to T4 are illustrated. A power supply line and a ground line are arranged in each of the circuit cell arrays. A plurality of power supply lines 301 and 311 and ground lines 302 and 312 as well as the plurality of circuit cell arrays T1 to T4 extend in an x direction in FIG. 3. The plurality of power supply lines 301 and 311 and ground lines 302 and 312 are arranged side by side in parallel to each other in a y direction in FIG. 3. The plurality of circuit cell arrays T1 to T4 are also arranged side by side in parallel to each other in the y direction in FIG. 3.

Each of the circuit cell arrays T1 to T4 has two regions of a Pch region and an Nch region. Two neighboring circuit cell arrays are arranged so that the Pch regions or Nch regions thereof are adjacent to each other. In addition, if the circuit cell arrays T1 and T2 are shifted in the y direction two circuit cell arrays, the circuit cell arrays T1 and T2 overlap with the circuit cell arrays T3 and T4. Namely, in FIG. 3, the circuit cell arrays T1 to T4 are arranged in a shift arrangement using two circuit cell arrays as a unit.

In the circuit cell arrays T1 and T3, two power supply lines of a main power supply line (a first power supply line) 301 and a pseudo ground line (a second power supply line) 312 are arranged. On the other hand, in the circuit cell arrays T2 and T4, two power supply lines of a main ground line (a third power supply line) 302 and a pseudo power supply line (a fourth power supply line) 311 are arranged. The main power supply line 301 is supplied with an internal power source voltage VPERI from a power supply generation circuit (not illustrated), for example. The main ground line 302 is supplied with a ground voltage VSS via a ground node, for example. The power supply lines or the ground lines that are adjacent to each other at a cell boundary (for example, the main ground line 302 and the pseudo ground line 312) are electrically insulated from each other.

In a functional circuit region, for example, circuits having desired functions, such as buffer circuits, are arranged. In a driver region, power gating driver transistors (switch circuits) DN1 and DP1 are arranged.

The driver transistor DN1 is arranged in Nch regions (for example, at a boundary portion between the circuit cell arrays T1 and T2). One of the source and drain nodes of the driver transistor DN1 is connected to the main ground line 302, and the other one of the nodes is connected to the pseudo ground line 312. The gate node of the driver transistor DN1 is supplied with a control signal CTR_N from a control signal line 322. When a functional circuit arranged in the functional circuit region is brought in an active state, the driver transistor DN1 receives the control signal CTR_N of an active level (high level) and is brought in a conductive state. As a result, the driver transistor DN1 connects the main ground line 302 and the pseudo ground line 312 and brings an pseudo ground voltage VSSZ of the pseudo ground line 312 to be substantially the same as the ground voltage VSS. On the other hand, when a functional circuit arranged in the functional circuit region is brought in an inactive state, the driver transistor DN1 receives the control signal CTR_N of an inactive level (low level) and is brought to be in a non-conductive state. As a result, the driver transistor DN1 electrically disconnects the main ground line 302 and the pseudo ground line 312 to bring the pseudo ground line 312 to be in a floating state.

The driver transistor DP1 is arranged in Pch regions (for example, at a boundary portion between the circuit cell arrays T2 and T3). One of the source and drain nodes of the driver transistor DP1 is connected to the main power supply line 301, and the other one of the nodes is connected to the pseudo power supply line 311. The gate node of the driver transistor DP1 is supplied with a control signal CTR_P from a control signal line 321. When a functional circuit arranged in the functional circuit region is brought in an active state, the driver transistor DP1 receives the control signal CTR_P of an active level (low level) and is brought in a conductive state. As a result, the driver transistor DP1 connects the main power supply line 301 and the pseudo power supply line 311 and brings an pseudo power source voltage VPERIZ of the pseudo power supply line 311 to be substantially the same as the power source voltage VPERI. On the other hand, when a functional circuit arranged in the functional circuit region is brought in an inactive state, the driver transistor DP1 receives the control signal CTR_P of an inactive level (high level) and is brought to be in a non-conductive state. As a result, the driver transistor DP1 electrically disconnects the main power supply line 301 and the pseudo power supply line 311 to bring the pseudo power supply line 311 to be in a floating state.

In FIG. 3, to supply a voltage to the pseudo power supply line 311' arranged in the circuit cell array T4, a main power supply line 301" is arranged on the outside of the circuit cell array T4. In this way, if a power supply line arranged on the outside of the circuit cell array on either end (in the y direction) is a pseudo power supply line or a pseudo ground line, a main power supply line or a main ground line may be arranged on the outside of the pseudo power supply line or the pseudo ground line.

Figure 4:
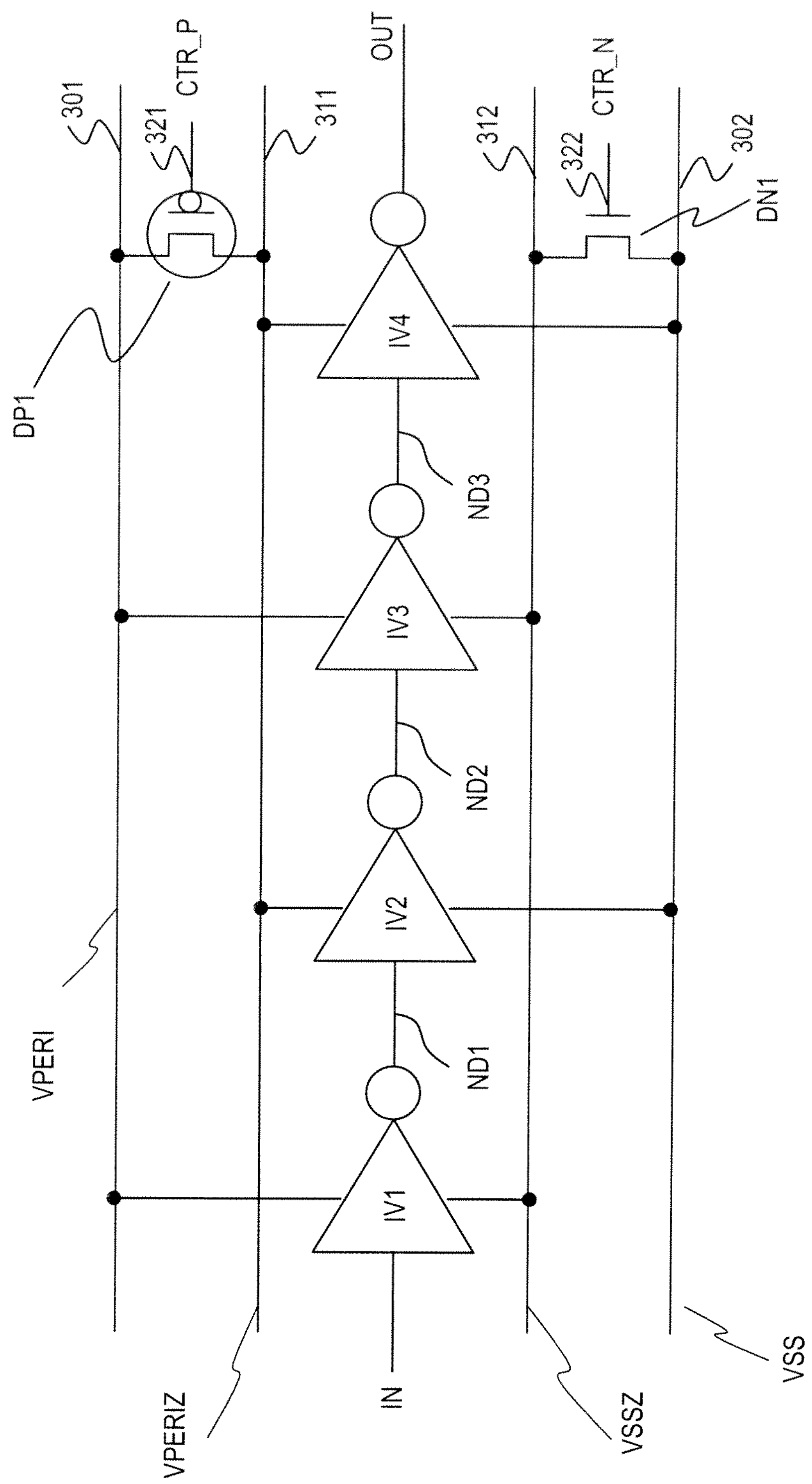
FIG. 4 illustrates configurations of circuits arranged in regions A1 and A2 in FIG. 3.

FIG. 4 illustrates circuits arranged in regions A1 and A2 in FIG. 3. In FIG. 4, the circuits include inverters IV1 to IV4 and the power gating driver transistors DP1 and DN1. The inverter IV1 is connected to the main power supply line 301 and the pseudo ground line 312, receives an input signal IN, and outputs an output signal to an intermediate node ND1. The inverter IV2 is connected to the pseudo power supply line 311 and the main ground line 302, receives the signal outputted from the inverter IV1, and outputs an output signal to an intermediate node ND2. The inverter IV3 is connected to the main power supply line 301 and the pseudo ground line 312, receives the signal outputted from the inverter IV2, and outputs an output signal to an intermediate node ND3. The inverter IV4 is connected to the pseudo power supply line 311 and the main ground line 302, receives the signal outputted from the inverter IV3, and outputs an output signal OUT. One of the source and drain nodes of the driver transistor DP1 is connected to the main power supply line 301, and the other one of the nodes is connected to the pseudo power supply line 311. The gate node of the driver transistor DP1 is supplied with the control signal CTR_P from the control signal line 321. One of the source and drain nodes of the driver transistor DN1 is connected to the main ground line 302, and the other one of the nodes is connected to the pseudo ground line 312. The gate node of the driver transistor DN1 is supplied with the control signal CTR_N from the control signal line 322.

Referring to FIGS. 3 and 4, the inverters IV1 to IV4 are arranged in the region A1 in the functional circuit region. More specifically, the inverters IV1 and IV3 are arranged in the circuit cell array T1 in the region A1 and the inverters IV2 and IV4 are arranged in the circuit cell array T2 in the region A1. The power gating driver transistors DP1 and DN1 are arranged in the region A2 in the driver region.

FIG. 5 illustrates a detailed layout of the functional circuit region A1 and the driver region A2 in FIG. 3. FIG. 5 illustrates a detailed layout of the circuits in FIG. 4. As illustrated in FIG. 5, the semiconductor device according to the present exemplary embodiment has a multi-level wiring structure. More specifically, a diffusion layer is formed in a semiconductor substrate, and a gate electrode is formed above the semiconductor substrate via a gate insulating film. In addition, the multi-level wiring structure includes: a tungsten wiring as a first layer wiring; a first aluminum wiring (1A1) as a second layer wiring formed above the first layer wiring via an insulating film; and a second aluminum wiring (2A1) as a third layer wiring formed above the second layer wiring via an insulating film. The first layer wiring and the diffusion layer are connected to each other via a contact. The second layer wiring and the first layer wiring are connected to each other via a first through hole, and the third layer wiring and the second layer wiring are connected to each other via a second through hole. While not illustrated in FIG. 5, additional upper wiring layers may be formed.

The semiconductor device according to the present exemplary embodiment is applicable to a circuit requiring three or more power supplies, such as to a power gating system. FIG. 5 illustrates a layout of circuits requiring four power supplies VPERI, VPERIZ, VSS, and VSSZ. More specifically, circuit cells are divided into a plurality of circuit cell arrays (two or more circuit cell arrays), to each of which a different power supply is supplied. In addition, each circuit cell array includes a power supply line and a ground line (the main power supply line 301 and the pseudo ground line 312 or the pseudo power supply line 311 and the main ground line 302). In addition, a wiring region connecting different circuit cell arrays is arranged. Wiring material extending over circuit cell arrays may be arbitrarily selected depending on the layout, if manufactured in a step different from that of the power supply lines.

For example, if circuits requiring a drive capability and executing buffering are arranged in the functional circuit region, the following relationship may be established in FIG. 5, that is, the width of the inverter IV1 in the x direction<the width of the inverter IV2 in the x direction<the width of the inverter IV3 in the x direction<the width of the inverter IV4 in the x direction. In such case, if an available region is created, the region can be used for arranging another circuit cell.

FIG. 6 illustrates insulation at a circuit cell array border between neighboring power supply lines, namely, insulation between the main power supply line 301 or the main ground line 302 and the pseudo power supply line 311 or the pseudo ground line 312 in an Nch region or a Pch region formed over circuit cell arrays illustrated in FIGS. 3 and 5. FIG. 6A illustrates the main power supply line 301 or the main ground line 302 at a circuit cell array border. In FIG. 6A, tungsten of the main power supply line 301 or the main ground line 302 is arranged to extend so that space satisfying a design criterion is left from the circuit cell array boundary. In addition, the first aluminum wiring (1AL) of the main power supply line 301 or the main ground line 302 is arranged to extend to the circuit cell array boundary. In addition, in FIG. 6A, the main power supply line 301 or the main ground line 302 is also connected to a diffusion layer (substrate voltage) via the first through hole, tungsten, and second through hole. The diffusion layer (substrate voltage) is a diffusion layer supplying a substrate voltage to the semiconductor substrate or to a well region formed in the semiconductor substrate. This substrate voltage is used as a back-gate voltage of a transistor formed on the semiconductor substrate.

FIG. 6B illustrates the pseudo power supply line 311 or the pseudo ground line 312 at a circuit cell array boundary. In FIG. 6B, tungsten of the pseudo power supply line 311 or the pseudo ground line 312 is arranged to extend to a circuit cell array boundary edge. In addition, the first aluminum wiring (1AL) of the pseudo power supply line 311 or the pseudo ground line 312 is arranged to extend so that space satisfying a design criterion is left from the circuit cell array boundary.

Other than the voltages, portions A and B in FIG. 6C have the same structure.

FIG. 6D illustrates a circuit cell array boundary by using FIG. 6A (lower portion) and FIG. 6B (upper portion). FIG. 6A is turned upside down in FIG. 6D. As illustrated in FIG.

6D, the Nch region or the Pch region formed over circuit cell arrays in FIGS. 3 and 5 is supplied with the substrate voltage from the diffusion layer (substrate voltage) in FIG. 6A.

FIGS. 7A and 7B illustrate meritorious effects provided by the semiconductor device according to the present exemplary embodiment. FIG. 7A illustrates a layout of the semiconductor device according to the present exemplary embodiment, and FIG. 7B illustrates a layout of a conventional example used for comparison.

In FIGS. 7A and 7B, a P-channel transistor P1 and an N-channel transistor N1 are transistors included in the inverter IV1, and a P-channel transistor P2 and an N-channel transistor N2 are transistors included in the inverter IV2. In addition, a P-channel transistor P3 and an N-channel transistor N3 are transistors included in the inverter IV3, and a P-channel transistor P4 and an N-channel transistor N4 are transistors included in the inverter IV4.

As illustrated in FIG. 7B, based on the conventional example, a total of four power supply lines and ground lines (1301, 1311, 1312, and 1302) are arranged in a circuit cell array T1. However, as illustrated in FIG. 7A, based on the semiconductor device according to the present exemplary embodiment, the main power supply line 301 and the pseudo ground line 312 are arranged in the circuit cell array T1, and the pseudo power supply line 311 and the main ground line 302 are arranged in the circuit cell array T2. Namely, based on the semiconductor device of the present exemplary embodiment, as compared with the conventional example, the number of power supply lines can be decreased by half and the width of the power supply lines can be increased.

According to the present exemplary embodiment, as a first meritorious effect, since each circuit cell array can include a power supply line and a ground line, the width of the power supply lines can be increased without increasing the wiring region thereof. In addition, as a second meritorious effect, since the width of the power supply lines can be increased, more through holes (TH) can be arranged. In addition, as a third meritorious effect, since tungsten wirings connect circuit cell arrays, aluminum (AL) wiring regions can be reduced.

FIGS. 8A and 8B illustrate a meritorious effect provided by the semiconductor device according to the present exemplary embodiment. FIG. 8A illustrates a layout of the semiconductor device according to the present exemplary embodiment, and FIG. 8B illustrates a layout of a conventional example used for comparison. Referring to portions indicated by alternate long and short dash lines in FIG. 8B, since the source power supplies are different, transistors cannot share a source. On the other hand, referring to portions indicated by alternate long and short dash lines in FIG. 8A, since circuit cell arrays are divided based on necessary power supplies, a single circuit cell array only includes transistors using the same power supplies. Thus, the transistors can share a source. Therefore, as a fourth meritorious effect, the semiconductor device according to the present exemplary embodiment can have a smaller mount area than that of the conventional example.

Figures 9A, 9B:
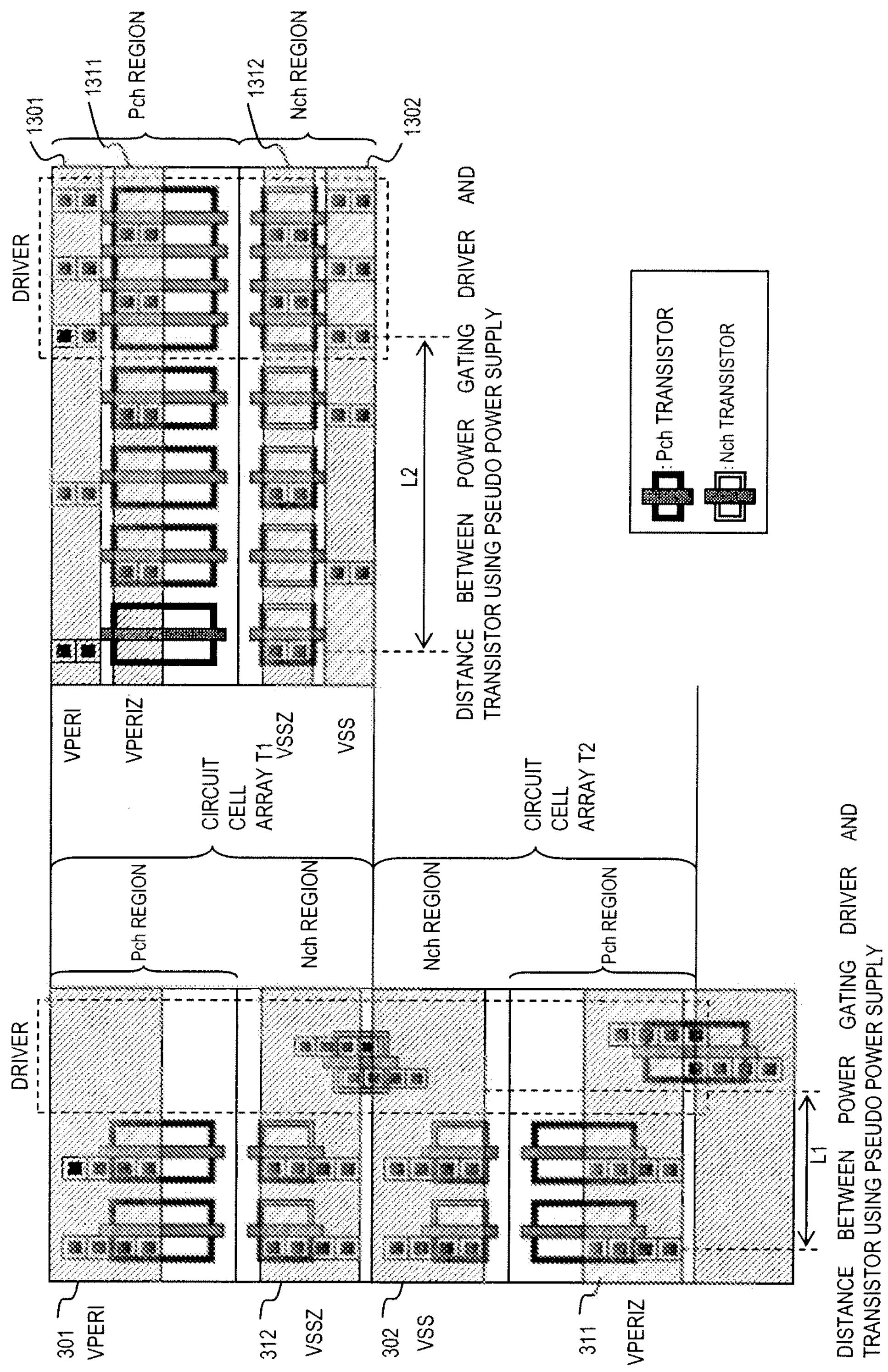
FIGS. 9A and 9B illustrate meritorious effects provided by the semiconductor device according to the exemplary embodiment.

FIGS. 9A and 9B illustrate meritorious effects provided by the semiconductor device according to the present exemplary embodiment. FIG. 9A illustrates a layout of the semiconductor device according to the present exemplary embodiment, and FIG. 9B illustrates a layout of a conventional example used for comparison. As illustrated in FIG. 9B, since transistors that do not use the pseudo power supply are inserted between a power gating driver and a transistor using the pseudo power supply, the wiring resistance is increased. On the other hand, as illustrated in FIG. 9A, based on the semiconductor device according to present exemplary embodiment, the distance between a power gating driver and a transistor using the pseudo power supply can be shortened. Thus, increase in wiring resistance can be suppressed (a fifth meritorious effect). Namely, a distance L1 in FIG. 9A can be set shorter than a distance L2 in FIG. 9B. In addition, since the fifth meritorious effect can shorten the length of the pseudo power supply line, capacity reduction can be achieved. As a result, a high-speed operation can be achieved (a sixth meritorious effect).

Based on the above first, second, and fifth meritorious effects, the power supply can be supplied through low resistance, and the power gating driver size can be reduced (a seventh meritorious effect).

Figure 10:
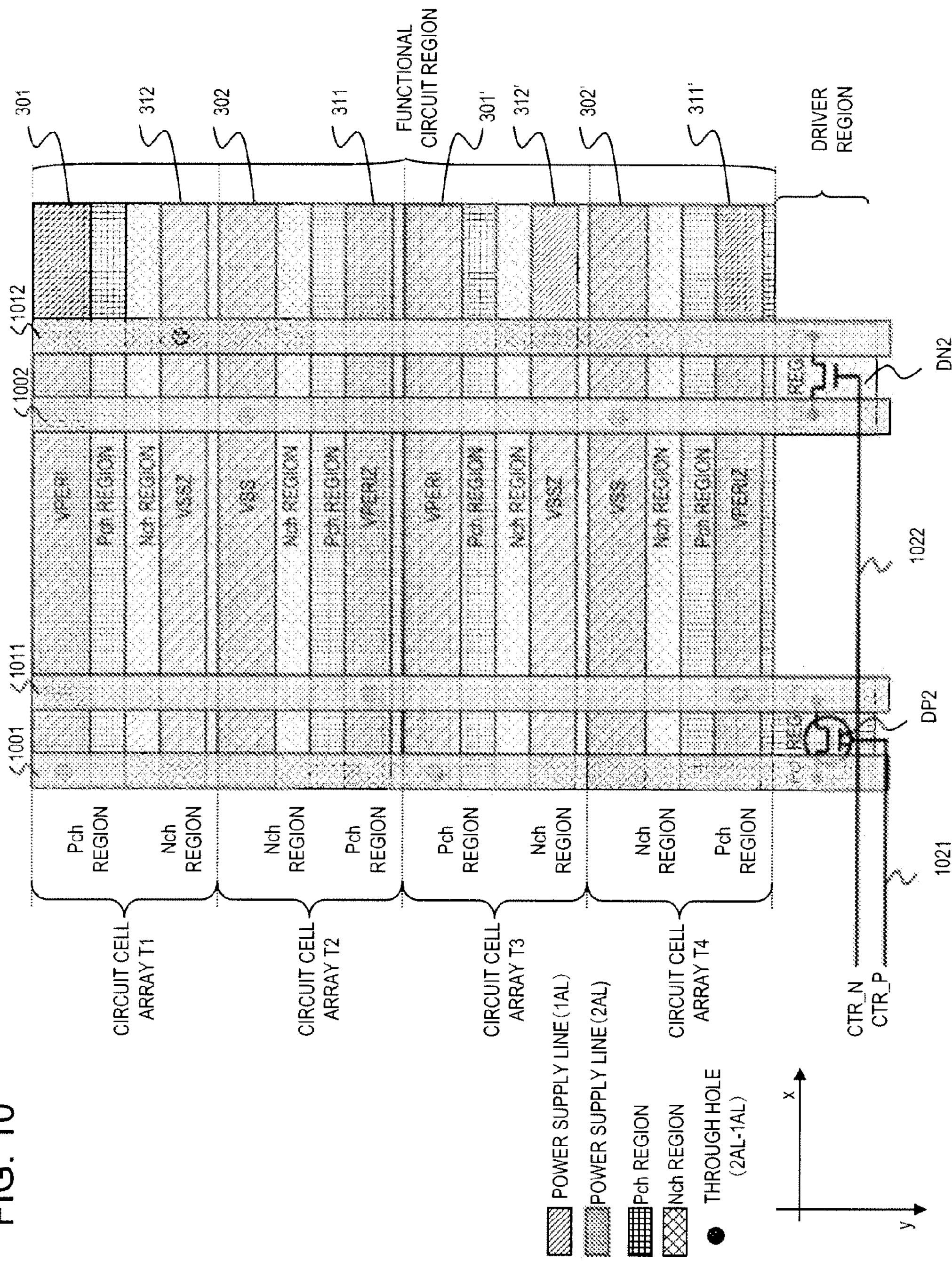
FIG. 10 illustrates a layout variation of the semiconductor device according to the exemplary embodiment.

Next, layout variations of the semiconductor device according to the present exemplary embodiment will be described with reference to the drawings. FIG. 10 illustrates a layout variation of the semiconductor device according to the present exemplary embodiment.

In FIG. 10, the driver region is arranged adjacent to the functional circuit region in the y direction, and second aluminum wirings (2AL) 1001, 1002, 1011, and 1012 are arranged to supply the power supply lines in the circuit cell arrays in the functional circuit region with the respective voltages. Black circles in FIG. 10 represent through holes connecting the second and first aluminum wirings (2AL) and (1AL).

Figure 11:
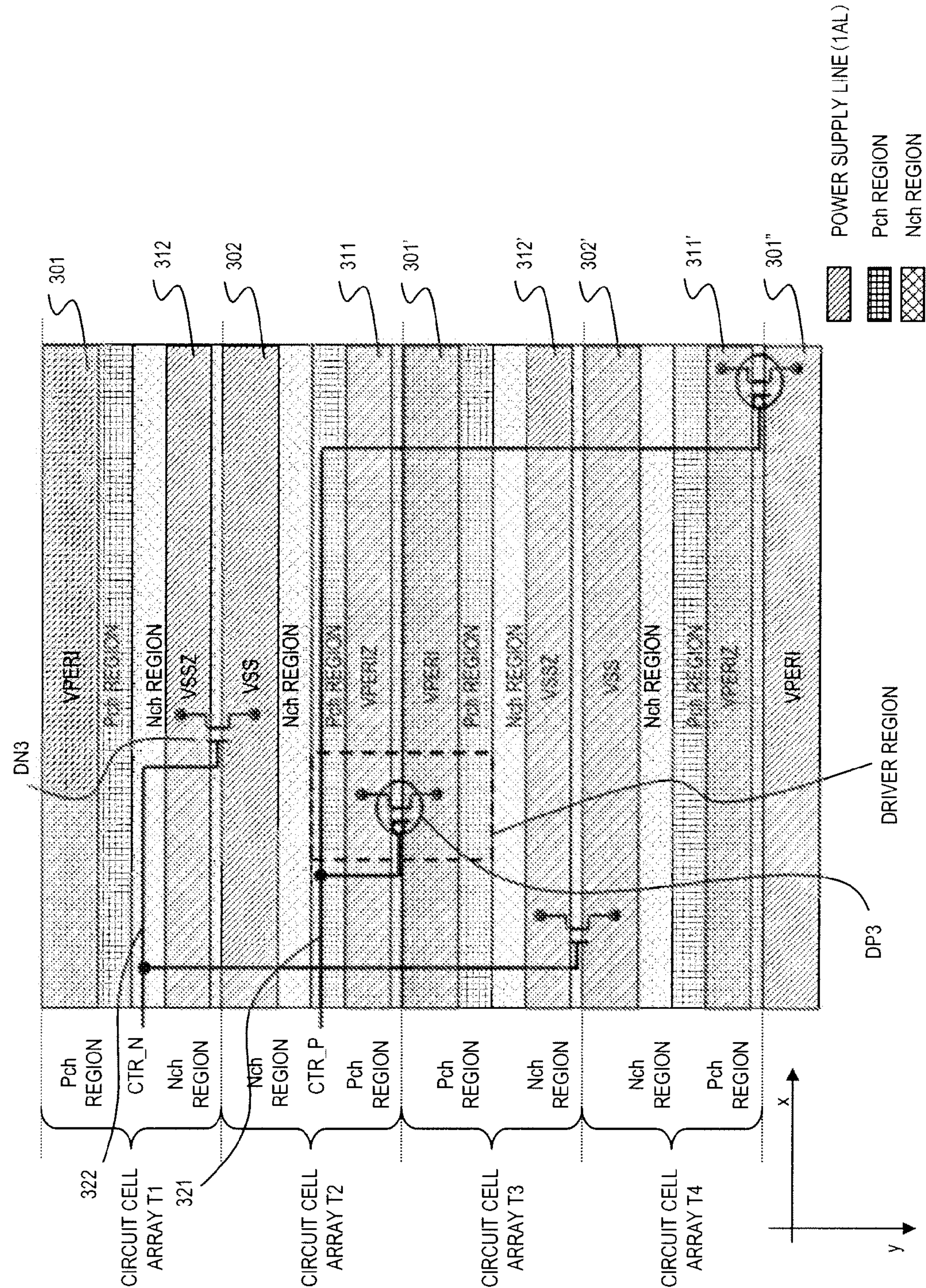
FIG. 11 illustrates a layout variation of the semiconductor device according to the exemplary embodiment.

FIG. 11 illustrates a layout variation of the semiconductor device according to the present exemplary embodiment. In FIG. 11, no dedicated driver region is arranged. Instead, power gating drivers are distributed in available regions or the like in the functional circuit region. For example, a driver circuit as illustrated in FIG. 12 is arranged in a driver region in FIG. 11.

Figure 12:
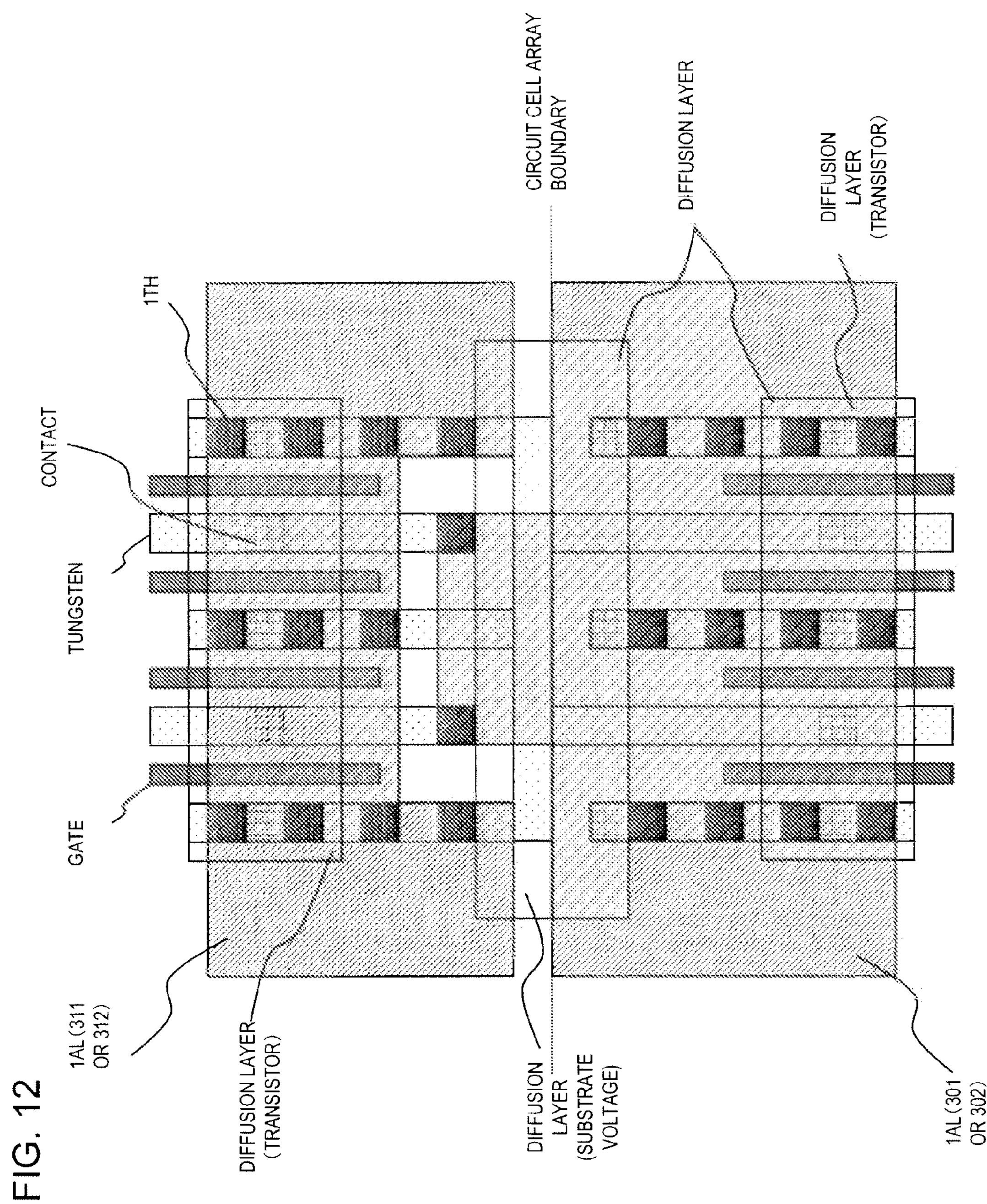
FIG. 12 illustrates a layout of a driver circuit arranged in a driver region in FIG. 11.

FIG. 12 illustrates a layout of a driver circuit arranged in a driver region in FIG. 11. Based on the semiconductor device according to the present exemplary embodiment, since each circuit cell array includes a single power supply line and a single ground line, power gating drivers can be formed as illustrated in FIG. 12.

In FIG. 12, regarding a power gating driver in the region of the pseudo power supply line 311 or the pseudo ground line 312, the first aluminum wiring (1AL) is connected to the pseudo power supply line 311 or the pseudo ground line 312 via a first through hole (1TH). The first aluminum wiring (1AL) extends from a circuit cell array boundary edge and is connected to the main power supply line 301 or the main ground line 302 via the first through hole (1TH). On the other hand, regarding a power gating driver in the region of the main power supply line 301 or the main ground line 302, the first aluminum wiring (1AL) is connected to the main power supply line 301 or the main ground line 302 via a first through hole (1TH). Tungsten is extended to the circuit cell array boundary edge, to be connected to the pseudo power supply line 311 or the pseudo ground line 312. By forming power gating drivers as illustrated in FIG. 12, the power gating drivers can be treated in the same way as normal circuit cells.

Figure 13:
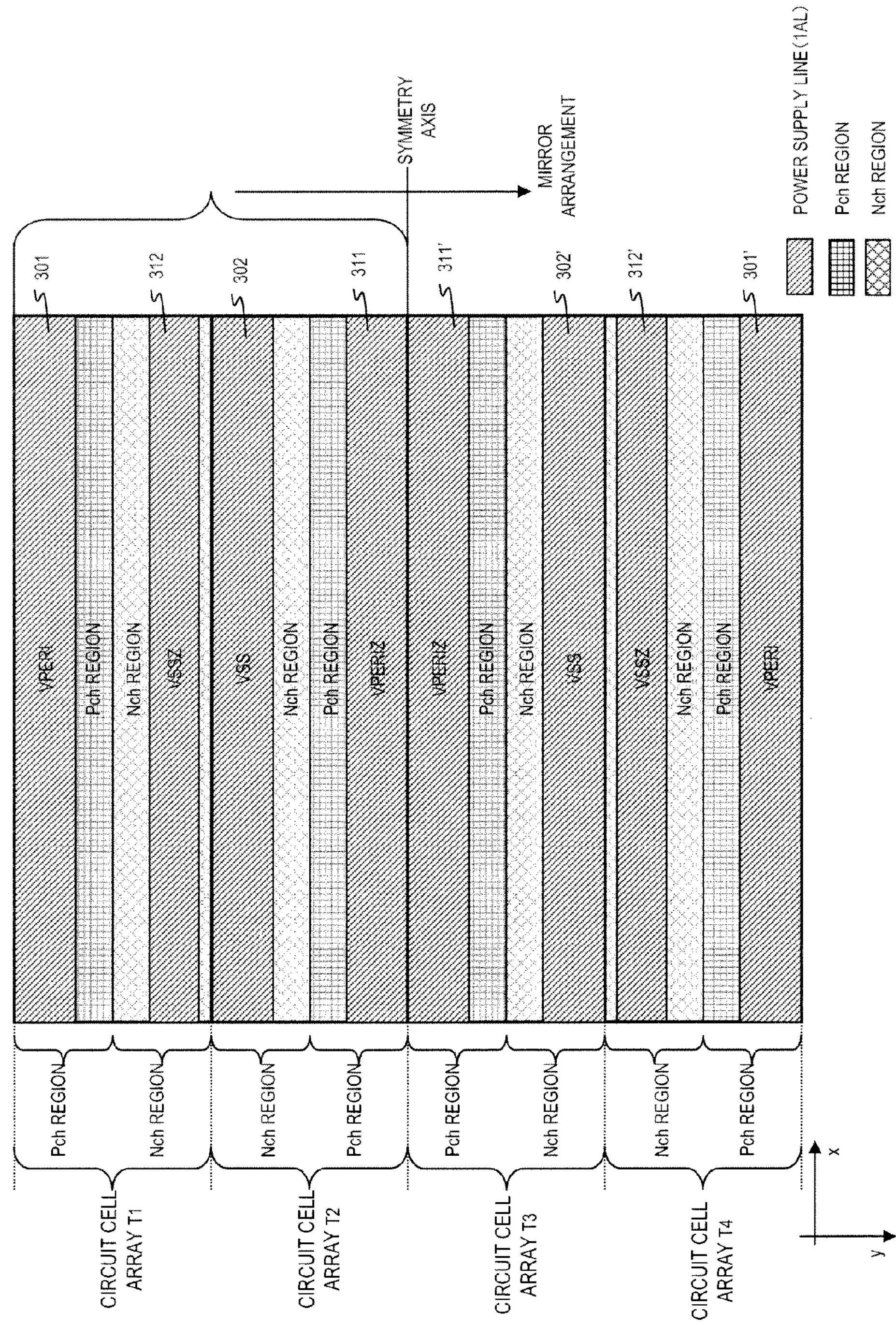
FIG. 13 illustrates a layout variation of the semiconductor device according to the exemplary embodiment.

FIG. 13 illustrates a layout variation of the semiconductor device according to the present exemplary embodiment. In FIG. 13, since two circuit cell arrays are arranged as a unit, the circuit cell arrays T1 to T4 are arranged in a mirror arrangement. More specifically, in FIG. 13, the circuit cell arrays T1 and T4 are symmetric about a symmetry axis. Likewise, the circuit cell arrays T2 and T3 are symmetric about the symmetry axis. In this case, the pseudo power supply lines 311 and 311' of the neighboring circuit cell arrays T2 and T3 can be short-circuited. Thus, based on this layout, the semiconductor device can have a thicker power supply line, as compared with the shift arrangement using two circuit cell arrays as illustrated in FIG. 3. In addition, with this mirror arrangement, a main power supply line or main ground line can be arranged as a power supply line on the outside of a circuit cell array at either end (in the y direction).

FIG. 14 illustrates a configuration when the circuit arranged in the region A1 in the functional circuit region in FIG. 3 includes other elements, in addition to inverters. As illustrated in FIG. 14, the circuit includes inverters IV5 and IV6 and NAND gates NA1 to NA4. The inverter IV5 is connected to the main power supply line 301 and the pseudo ground line 312, receives the input signal IN, and outputs an output signal to an input node of the inverter IV6. The inverter IV6 is connected to the pseudo power supply line 311 and the main ground line 302, receives the signal outputted from the inverter IV5, and outputs an output signal to an intermediate node ND4. The NAND gate NA1 is connected to the main power supply line 301 and the pseudo ground line 312, receives the signal outputted from the inverter IV6 and an input signal IN1, and outputs an output signal OUT1. The NAND gate NA2 is connected to the main power supply line 301 and the pseudo ground line 312, receives the signal outputted from the inverter IV6 and an input signal IN2, and outputs an output signal OUT2. The NAND gate NA3 is connected to the main power supply line 301 and the pseudo ground line 312, receives the signal outputted from the inverter IV6 and an input signal IN3, and outputs an output signal OUT3. The NAND gate NA4 is connected to the main power supply line 301 and the pseudo ground line 312, receives the signal outputted from the inverter IV6 and an input signal IN4, and outputs an output signal OUT4.

FIG. 15 illustrates a layout of the circuit in FIG. 14. As illustrated in FIG. 15, the inverter IV5 and the NAND gates NA1 to NA4 using the main power supply line 301 and the pseudo ground line 312 are arranged in the circuit cell array T1. On the other hand, the inverter IV6 using the pseudo power supply line 311 and the main ground line 302 is arranged in the circuit cell array T2.

The semiconductor device according to the present exemplary embodiment is applicable, even if other circuits are included in addition to inverters as illustrated in FIG. 14. Namely, since only one power supply line and one ground line are arranged in each circuit cell array, the width of the power supply line and the ground line can be increased, compared with an example where a plurality of power supply lines and ground lines are arranged in a circuit cell array. As a result, wiring resistance of the power supply line and the ground line can be reduced.

In addition, in FIG. 15, since tungsten is used to form wirings that extend over the circuit cell arrays T1 and T2, tungsten can be used for the intermediate node ND4. Thus, the wiring region of the first aluminum wiring (1AL) can be reduced.

Modifications and adjustments of the exemplary embodiment are possible within the scope of the overall disclosure (including the claims) of the present disclosure and based on the basic technical concept of the present disclosure. Various combinations and selections of various disclosed elements (including each element of each claim, each element of each exemplary embodiment, each element of each drawing, etc.) are possible within the scope of the claims of the present disclosure. That is, the present disclosure of course includes various variations and modifications that could be made by those skilled in the art according to the overall disclosure including the claims and the technical concept.

What is claimed is:

1. A semiconductor device comprising:

a circuit unit including:

a first circuit cell array extending in a first direction;

a second circuit cell array extending in the first direction substantially in parallel to the first circuit cell array;

first and second power supply lines each extending in the first direction and arranged over the first circuit cell array, the first power supply line being supplied with a first power source voltage;

a third power supply line extending in the first direction separately from the second power supply line, arranged over the second circuit cell array without hanging over the first circuit cell array, and supplied with a second power source voltage;

a first transistor coupled between the second power supply line and the third power supply line; and a first circuit arranged in the first circuit cell array and including a first power supply node coupled to the first power supply line and a second power supply node coupled to the second power supply line, wherein the circuit unit is configured to reduce a subthreshold leakage current of the first circuit.

2. The semiconductor device according to claim 1, wherein the first transistor connects, when brought in a conductive state thereof, the second power supply line to the third power supply line so that the second power supply line is supplied with the second power source voltage from the third power supply line, and disconnects, when brought in a non-conductive state thereof, the second power supply line from the third power supply line.

3. The semiconductor device according to claim 2, wherein the first transistor is in the conductive state thereof in a condition in which the first circuit is in an active state thereof, and is in the non-conductive state thereof in a condition in which the first circuit is in an inactive state thereof.

4. The semiconductor device according to claim 1, wherein the circuit unit further comprises:

a fourth power supply line extending in the first direction and arranged over the second circuit cell array;

a fifth power supply line extending in the first direction separately from the fourth power supply line, and supplied with the first power source voltage;

a second transistor coupled between the fourth power supply line and the fifth power supply line; and a second circuit arranged in the second circuit cell array and including a third power supply node coupled to fourth power supply line and a fourth power supply node coupled to the third power supply line, and the circuit unit is further configured to reduce a subthreshold leakage current of the second circuit.

5. The semiconductor device according to claim 4, wherein the circuit unit further comprises a signal line transmitting a signal between the first circuit and the second circuit.

6. The semiconductor device according to claim 5, further comprising a multi-level wiring structure including a first wiring layer and a second wiring layer formed over the first wiring layer, and wherein each of the first, second, third, fourth, and fifth power supply lines is formed as the first wiring layer, and the signal line is formed as the second wiring layer.

7. The semiconductor device according to claim 1, wherein the first circuit cell array comprises:

a first region of a first conductivity type extending in the first direction; and a second region of a second conductivity type extending in the first direction, the second circuit cell array comprises:

a third region of the second conductivity type extending in the first direction; and a fourth region of the first conductivity type extending in the first direction, and the first, second, third and fourth regions are arranged in a second direction substantially perpendicular to the first direction, the second region is disposed between the first and third regions, and the third region is disposed between the second and fourth regions.

8. The semiconductor device according to claim 7, wherein the second region of the first circuit cell array and the third region of the second circuit cell array are electrically connected to each other.

9. The semiconductor device according to claim 7, wherein the first transistor is arranged astride over the second region of the first circuit cell array and the third region of the second circuit cell array.

10. The semiconductor device according to claim 7, wherein the first power supply line is arranged over the first region of the first circuit cell array, the second power supply line is arranged over the second region of the first circuit cell array, and the third power supply line is arranged over the third region of the second circuit cell array.

11. The semiconductor device according to claim 1, wherein the first circuit cell array comprises a functional circuit region and a driver region, the functional circuit region and the driver region are arranged in the first direction, the first circuit is arranged in the functional circuit region, and the first transistor is arranged in the driver region.

12. The semiconductor device according to claim 1, wherein the first circuit comprises a plurality of functional circuit cells, and the first transistor is inserted between two of the plurality of functional circuit cells.

13. The semiconductor device according to claim 1, further comprising:

a fourth power supply line extending in a second direction substantially perpendicular to the first direction and connected to the second power supply line via a first through hole, and a fifth power supply line extending in the second direction substantially parallel to the fourth power supply line and connected to the third power supply line via a second through hole, and wherein the first transistor is coupled to the second power supply line via the fourth power supply line and is coupled to the third power supply line via the fifth power supply line.

14. The semiconductor device according to claim 13, wherein the circuit unit further comprises:

a driver region formed so that the first and the second circuit cell arrays and the driver region are arranged in the second direction, the second circuit cell array is sandwiched between the first circuit cell array and the driver region, and wherein the first transistor is formed in the driver region.

15. The semiconductor device according to claim 1, wherein the first transistor serves as a power gating transistor.

16. The semiconductor device according to claim 1, wherein the circuit unit further comprises a second circuit arranged in the second circuit cell array and including a third power supply node coupled to the third power supply line, and the circuit unit is further configured to reduce a subthreshold leakage current of the second circuit.

17. The semiconductor device according to claim 16, wherein the first circuit includes a first output terminal, the second circuit includes a first input terminal, and the circuit unit further comprises a first signal line coupled between the first output node of the first circuit and the first input node of the second circuit and extending in a second direction that is crossing to the first direction.

18. The semiconductor device according to claim 17, further comprising a multi-level wiring structure including a first wiring layer and a second wiring layer formed over the first wiring layer, and wherein each of the first, second, and third power supply lines is formed as the first wiring layer, and the signal line is formed as the second wiring layer.

19. The semiconductor device according to claim 1, wherein the third power supply line includes a first portion located over the second circuit cell array, the first transistor includes source and drain diffusion layers, and the device further comprises a conductive path being in contact with the first portion of the third power supply line at one end thereof and coupled to one of the source and drain diffusion layers of the first transistor at the other end thereof.

20. The semiconductor device according to claim 1, wherein the circuit unit further comprises a plurality of second circuits each arranged in the first circuit array and coupled to the second power supply line, and the first circuit array is free from including any circuits that are not coupled to the second power supply line.

* * * * *